United States Patent [19]
Deans et al.

[11] Patent Number: 5,793,687
[45] Date of Patent: Aug. 11, 1998

[54] MICRO ROM TESTING SYSTEM USING MICRO ROM TIMING CIRCUITRY FOR TESTING OPERATIONS

[75] Inventors: Russell C. Deans, Durham; Bartt H. Richards, Raleigh, both of N.C.

[73] Assignee: Mitsubishi Semiconductor America, Inc., Durham, N.C.

[21] Appl. No.: 760,007

[22] Filed: Dec. 3, 1996

[51] Int. Cl.$^6$ ............................................. G11C 7/00
[52] U.S. Cl. ........................ 365/201; 371/22.2; 371/22.3
[58] Field of Search .................... 365/201; 371/22.2, 371/22.3

[56] References Cited

U.S. PATENT DOCUMENTS

| | | | |
|---|---|---|---|
| 3,958,110 | 5/1976 | Hong et al. | 235/153 |
| 4,490,783 | 12/1984 | McDonough et al. | 364/200 |
| 4,495,629 | 1/1985 | Zasio et al. | 377/70 |
| 4,768,196 | 8/1988 | Jou et al. | 371/25 |
| 4,855,669 | 8/1989 | Mahoney | 324/73 |
| 4,860,290 | 8/1989 | Daniels et al. | 371/22.3 |
| 5,047,710 | 9/1991 | Mahoney | 324/158 |
| 5,206,861 | 4/1993 | Hannon et al. | 371/22.3 |
| 5,210,759 | 5/1993 | DeWitt et al. | 371/22.3 |
| 5,226,149 | 7/1993 | Yoshida et al. | 395/575 |
| 5,252,917 | 10/1993 | Kadowaki | 324/158 |
| 5,271,019 | 12/1993 | Edwards et al. | 371/22.3 |
| 5,521,865 | 5/1996 | Ohuchi et al. | 365/185.22 |
| 5,528,601 | 6/1996 | Schmookler | 371/22.3 |
| 5,596,584 | 1/1997 | Warren | 371/22.3 |

*Primary Examiner*—David C. Nelms
*Assistant Examiner*—Hoai Ho
*Attorney, Agent, or Firm*—McDermott, Will & Emery

[57] ABSTRACT

Micro ROM testing is provided using timing logic and clocks utilized in normal operation of the micro ROM. A PLA in the micro ROM has its output lines coupled to read amplifiers that receive values read from the PLA locations selected by address inputs. The read amplifiers latch the PLA values into timing generators to produce timing signals of various types supplied to a microcontroller associated with the micro ROM. A test signal is supplied to the timing generators to disconnect them from the outputs of the read amplifiers and to establish a scan chain composed of the timing generators connected in series. Non-overlapping clock signals supplied by a system clock of the microcontroller cause the latched PLA values to shift through the timing generators in the scan chain. At a scan output of the last timing generator in the scan chain, the PLA values are observed and compared with the values expected from the selected PLA locations.

23 Claims, 8 Drawing Sheets

(Background)

(Background)

(Background)

MICRO ROM TESTING SYSTEM USING MICRO ROM TIMING CIRCUITRY FOR TESTING OPERATIONS

TECHNICAL FIELD

The present invention relates to microcontrollers, and more particularly, to testing the operation of a micro read-only memory (micro ROM) in a microcontroller.

BACKGROUND ART

To provide process control, a microcontroller executes an instruction set defined by a user program. Each instruction of the program may require multiple internal steps to implement. These internal steps are called microcycles. A microinstruction is required to direct each microcycle. The microinstructions to be executed to complete the user instruction set are stored in a ROM called the micro ROM. The micro ROM may be provided on the microcontroller chip, or on a separate micro ROM chip, which enables designers to change some of the microinstructions to fill their particular requirements. As the micro ROM requires addressing, a microprogram counter (micro PC) is utilized to generate address inputs supplied to the micro ROM.

Reference is now made to FIG. 1 showing a simplified block diagram of a CPU in a microcontroller that contains a micro ROM 2. A micro PC 4 generates address inputs to retrieve required microinstructions from the micro ROM 2. A control logic 6 that may combine an instruction register, an instruction decoder and a program counter, controls the micro PC 4 to receive microinstructions from the micro ROM 2. The control logic 6 links all diverse registers in the microcontroller to perform requirements of a particular instruction executed by a data path 8.

Microcontrollers are by their very nature sequential devices. They execute instructions one at a time and can be utilized to control multiple events that occur at different moments in any required sequence. Thus, a sequential circuit is required to control the incidence of each event. To provide sequential control of the microcontroller, the micro ROM may store microinstructions in a programmable logic array (PLA) having timing latches at its outputs for supplying the microcontroller with microinstructions represented by timing signals that control sequential events.

An example of a typical PLA shown in FIG. 2 represents an Intersil IM5200 field programmable logic array (FPLA) that has an array of 48 AND gates having their inputs selectable from 14 input lines $I_0$-$I_{13}$ and their internally generated inverses. The outputs of the AND gates drive the inputs of 8 OR gates. Any combination of the 48 AND gate outputs can be selected for each of the OR gates. The outputs $F_0$-$F_8$ of the OR gates supply output timing signals. Fusible links are used to program the PLA. If the OR gates are not needed, the device is programmed such that one AND gate drives each OR gate.

A conventional method for testing a PLA uses a scan test that involves supplying known input signals to the PLA. The output signals generated by the PLA in response to the known input signals are measured. A malfunction is indicated when the predicted output signals do not match up with the measured output signals. As shown in FIG. 3, a typical scan testing arrangement for a micro ROM 20 includes a test shift register 30 used solely for the purpose of functional testing. Address inputs from a micro PC are decoded by an address decoder 22 that selects input lines of a PLA 24. In response, microprograms stored in the PLA 24 are supplied to the test shift register 30 composed of test blocks 32, each of which receives data from the corresponding output of the PLA 24. A serial output line SCAN OUT is provide observe the output values scanned out of the micro ROM 20. To provide data shift, the test blocks of the shift register 30 are supplied with test clocks. The sequencing of the clocks signals, test signals and address signals depends on the configuration of the test blocks 32.

Thus, the conventional scan test requires an additional test logic circuit, and an additional source of test clocks to be supplied to the test circuit. Moreover, as malfunction of the test logic circuit may corrupt scan test results, the test logic circuit itself must be checked before testing the PLA.

Accordingly, it would be desirable to provide a micro ROM testing system that does not require a separate test logic circuit.

Also, it would be desirable to provide a micro ROM testing system that does not require separate test clocks.

Further, it would be desirable to provide a micro ROM testing system that is low in cost and easily implemented.

DISCLOSURE OF THE INVENTION

Accordingly, one advantage of the invention is in providing a system that allows a micro ROM to be tested without a separate test logic circuit.

Another advantage of the invention is in providing a micro ROM testing system that does not require separate test clocks.

Another advantage of the invention is in providing a micro ROM testing system that is low in cost and easily implemented.

The above and other advantages of the invention are achieved, at least in part, by providing a read-only memory device that has a memory array and a plurality of timing circuits for generating timing signals to represent data read from the memory array. A controlled gate circuit is provided to disconnect inputs of the timing circuits from the memory array and to establish a test scan chain composed of the timing circuits connected in series for testing the memory array.

Preferably, the memory array stores microinstructions to control a microcontroller. The test scan chain is supplied with clock signals of the microcontroller to provide data shift through the timing circuits.

In accordance with one aspect of the invention, a test signal may be supplied to the controlled gate circuit that enables each of the timing circuits to output a timing signal controlling microcontroller when the test signal is at a first logic level, and establishes the test scan chain of the timing circuits when the test signal is at a second logic level.

In accordance with another aspect of the invention, the controlled gate circuit may comprise an input pass gate coupled between an input of each timing circuit and the memory array, and an output pass gate provided at a scan output of the timing circuit. The input and output pass gates are controlled by the test signal so as to disconnect the timing circuit from the memory array and to connect the timing circuit through its scan output to a scan input of an adjacent timing circuit.

In accordance with a further aspect of the invention, the plurality of timing circuits may comprise first timing circuits for generating first timing signals, and second timing circuits for generating second timing signals delayed with respect to the first timing signals.

Preferably, each of the first timing circuits comprises a first pass gate controlled by a first clock signal, and a first memory cell for latching data transferred through the first pass gate to generate the first timing signal. A second pass gate controlled by a second clock signal is coupled to the first memory cell. A second memory cell connected to a scan output is used for latching data transferred through the second pass gate.

Each of the second timing circuits may comprise a first pass gate controlled by the first clock signal, a first memory cell for latching data transferred through the first pass gate, a second pass gate controlled by the second clock signal coupled to an output of the first memory cell, and a second memory cell for latching data transferred through the second pass gate to generate the second timing signal.

In accordance with a method of the present invention, the following steps are carried out for testing a read-only memory having a memory array and timing generators connectable to output lines of the memory array:

connecting inputs of the timing generators to the output lines to receive the data from tested cells of the memory array, disconnecting the inputs of the timing generators from the output lines, connecting the timing generators in series to establish a scan chain, shifting the data received from the tested cells through the timing generators in the scan chain, and observing the data from the tested cell at an output of the last timing generator in the scan chain.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of logic circuit testing, the best mode for practicing the invention is based in part on the realization of a system for testing a micro ROM in a microcontroller.

Figure 1:
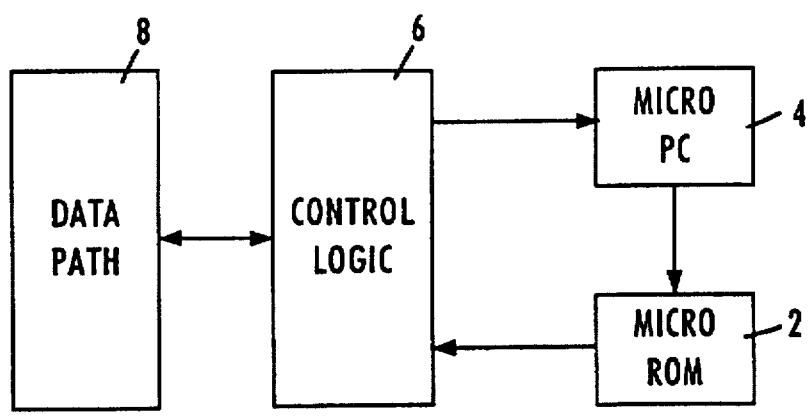
FIG. 1 illustrates interaction between a micro. ROM and other microcontroller elements.
Figure 2:
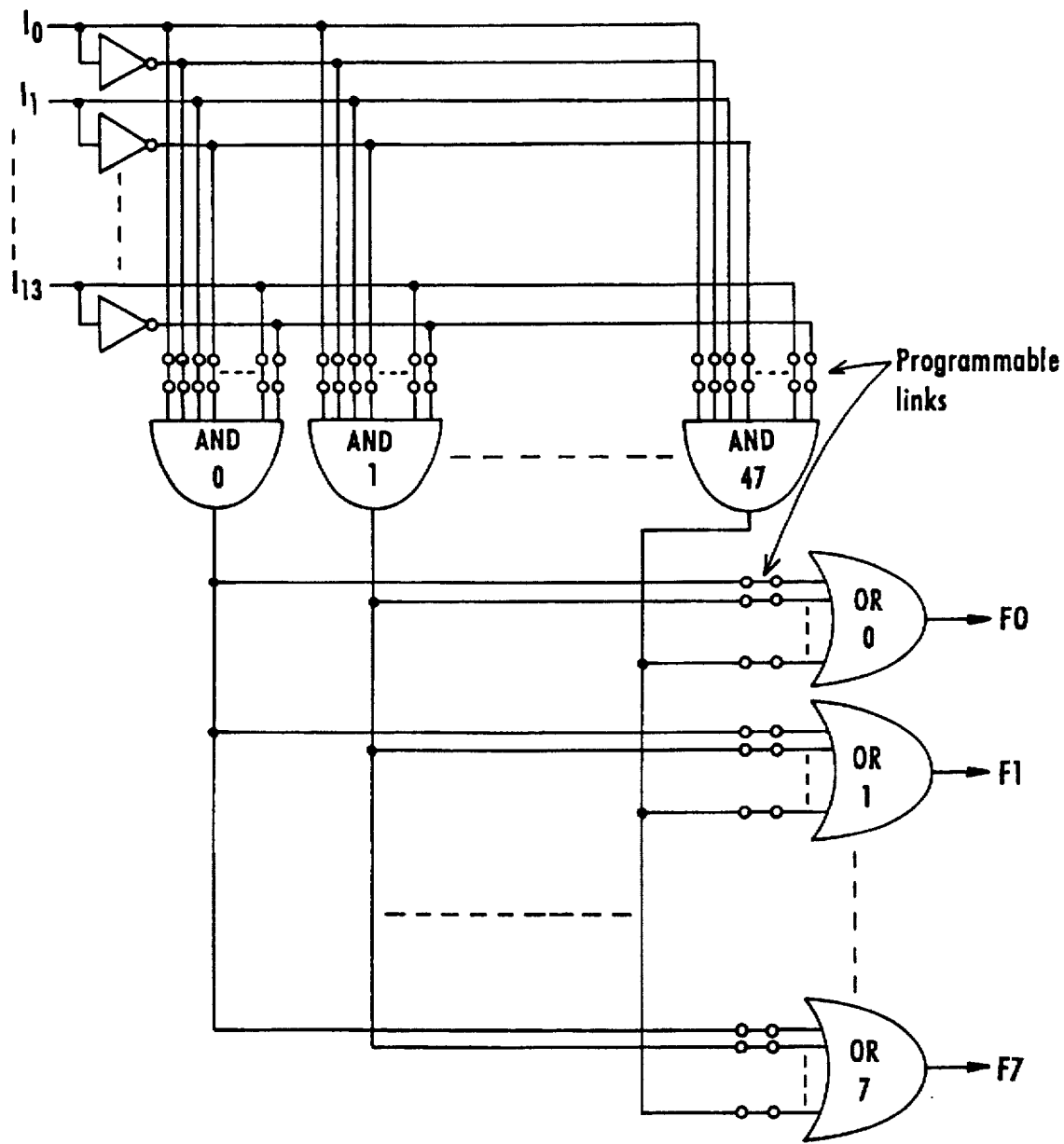
FIG. 2 shows an example of a PLA.
Figure 3:
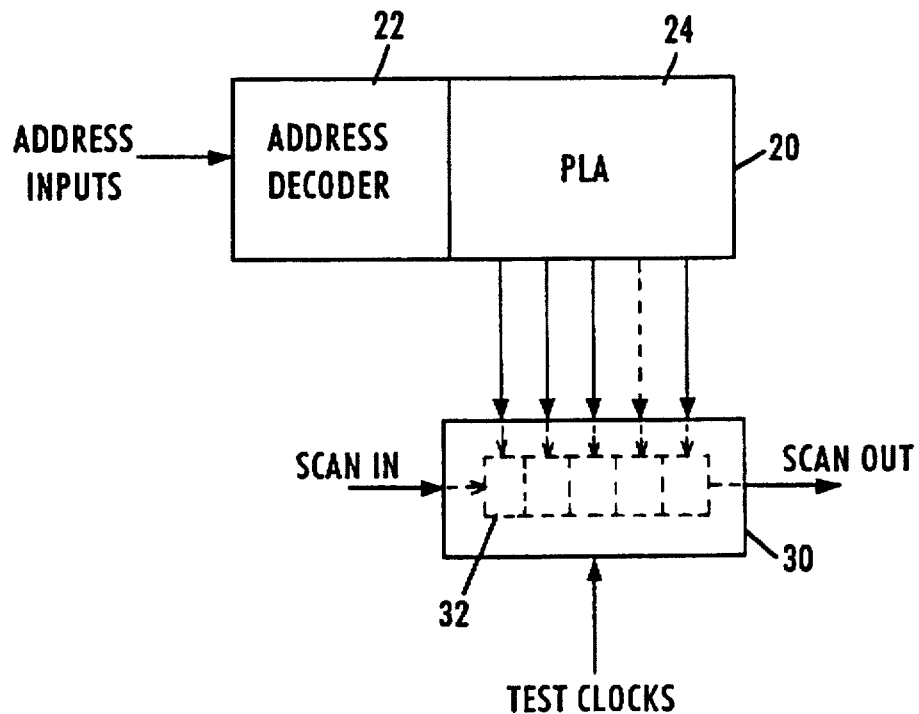
FIG. 3 illustrates a prior art system for testing a micro ROM.
Figure 4:
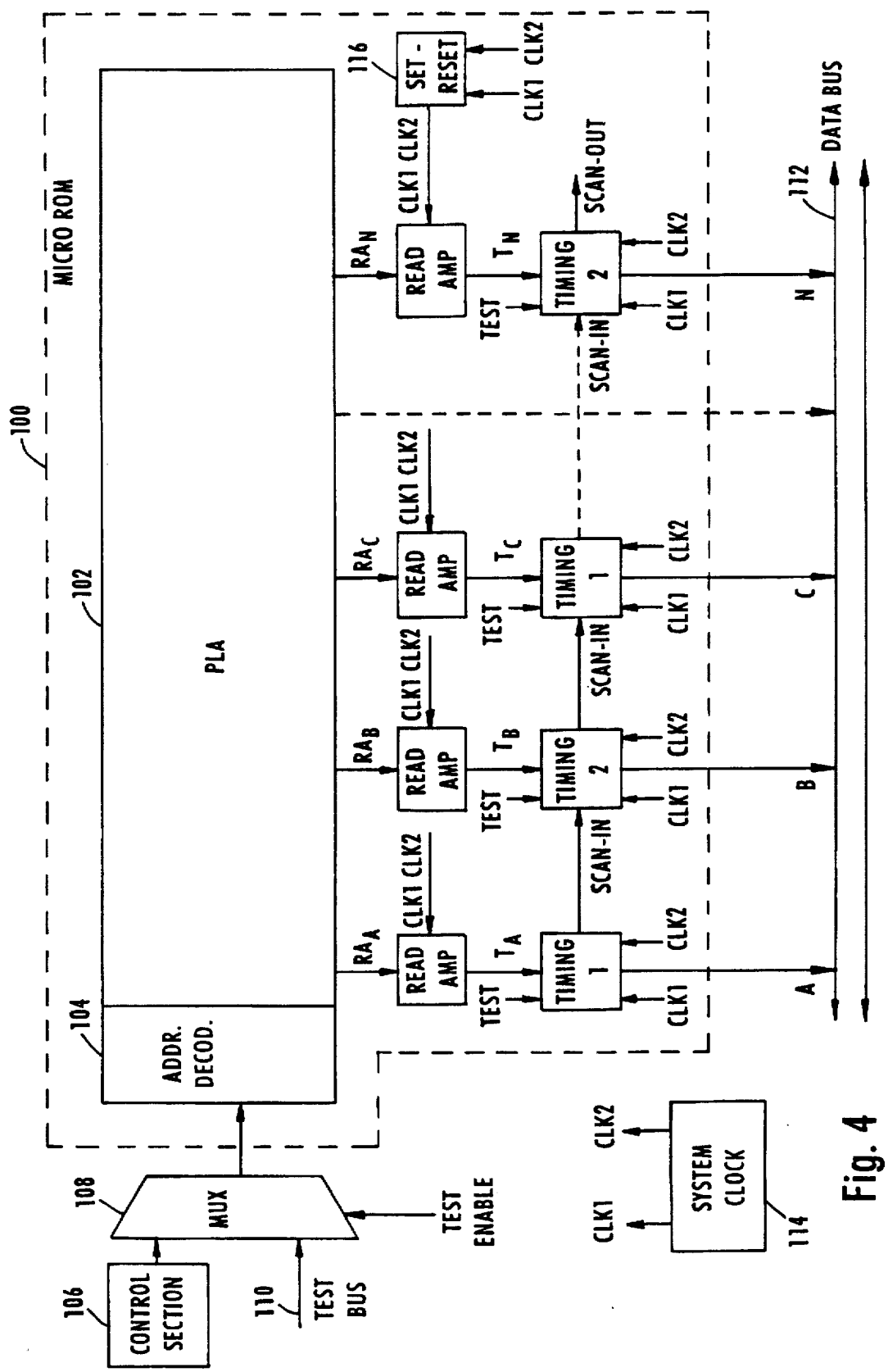
FIG. 4 is a block diagram of a system for testing a micro ROM in accordance with the present invention.

Reference is now made to FIG. 4 that schematically illustrates a micro ROM 100, and its interactions with various microcontroller elements. The micro ROM 100 comprises a PLA 102 that stores preprogrammed microinstructions of the microcontroller. An address decoder 104 is coupled to the input lines of the PLA 102 to decode address input signals supplied by a control section 106 of the microcontroller. The control section 106, may for example, include a microprogram counter, instruction register, and instruction decoder. The address decoder 104 is coupled with the control section 106 through a test enabling multiplexer 108 that allows the micro ROM 100 to be switched between a regular read mode and a test mode. The multiplexer 108 is supplied with a test bus enable signal generated by an external generator to allow a test bus 110 to be coupled to the address decoder 104 to supply it with test address input signals produced by the microcontroller. A timing signal bus 112 supplies timing signals to various elements of the microcontroller, for example, to an internal data bus of a CPU. A microcontroller system clock 114 supplies various microcontroller elements, including the micro ROM 100, with non-overlapping clock signals CLK1 and CLK2 respectively shown in FIGS. 5A and 5B to synchronize the operation of the microcontroller elements.

As discussed above, the microcontroller sequentially executes one instruction at a time to control multiple events that occur at different moments in a required sequence. Therefore, the microinstructions supplied from the micro ROM 100 to the microcontroller through the timing signal bus 112 must be represented by output timing signals A, B, C, . . . , N produced at sequential moments. The micro ROM 100 may produce multiple types of timing signals required to control a certain number of sequential events. For example, the output signal A may be a timing 1 signal, and the output signal B may be a timing 2 signal defining different timing with respect to the timing 1 signal. The signals A and B may be followed by other timing 1 and timing 2 signals, followed by other timing 1 and timing 2 signals, etc. It is to be understood that the present invention is applicable to any sequence of the timing signals.

Figure 5:
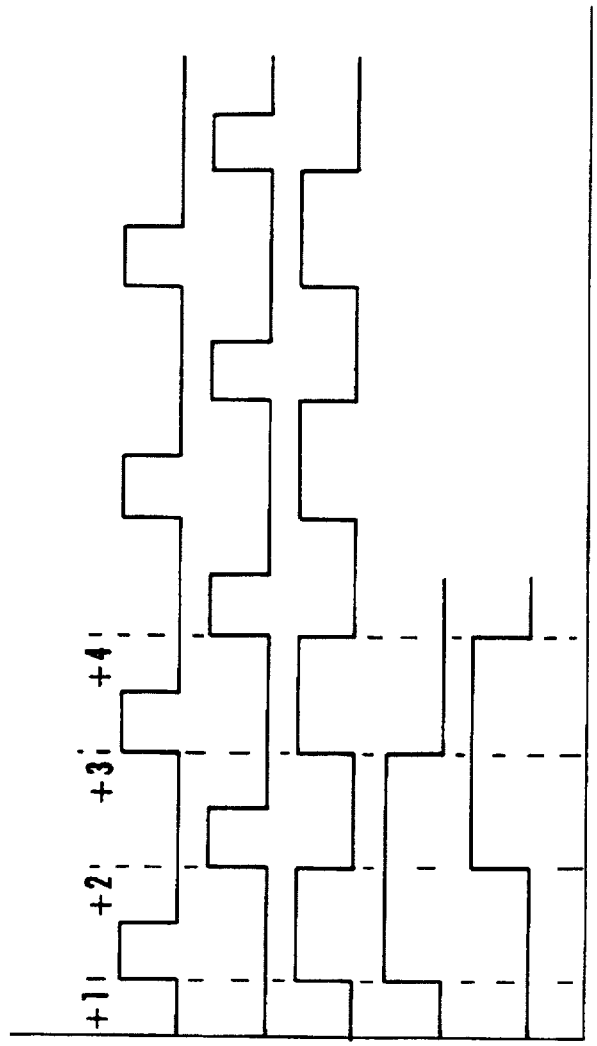
FIGS. 5A–5E and 6A–6D illustrate various signals associated with the micro ROM testing system.

For the sake of clarity, FIG. 4 illustrates only circuits that produce the output signals A, B, C and N. The number N of the produced output signals corresponds to the number of the PLA output lines. Read amplifiers $RA_A$, $RA_B$, $RA_C$, . . . . . $RA_N$ are coupled to the output lines of the PLA 102 to read output data. A set/reset circuit 116 is supplied with the clock signals CLK1 and CLK2 to produce a set/reset signal CLK1CLK2 (FIG. 5C) used to precharge the read amplifiers $RA_A$–$RA_N$ to precondition them to the PLA output lines. The read amplifiers $RA_A$–$RA_N$ transfer the read data to timing generators $T_A$, $T_B$, $T_C$, . . . , $T_N$ that produce timing 1 and timing 2 signals A, B, C, . . . , N supplied through the timing signal bus 112 to the microcontroller. For example, the timing generators $T_A$ and $T_C$ may be timing 1 circuits that produce timing 1 signals shown in FIG. 5D, and the timing generators $T_B$ and $T_N$ are timing 2 circuits that produce timing 2 signals (FIG. 5E). As will be disclosed in more detail later, the timing 2 circuits may comprise the timing 1 circuit and an additional latch that converts a timing 1 signal into a timing 2 signal. The timing generators $T_A$–$T_N$ are supplied with the clocks signals CLK1 and CLK2 from the system clock 114. As shown in FIGS. 5A and 5D, at moment t1, the CLK1 signal causes the timing 1 signal to go high, whereas the next CLK1 signal at moment t3 causes the timing 1 signal to go low. Similarly, the timing 2 signal is active between moment t2 when the CLK2 signal is supplied, and moment t4 when the next CLK2 signal is generated (FIGS. 5B and 5E).

To carry out the scan test of the PLA 102, the timing generator $T_A$ is provided with a SCAN-OUT output coupled to a SCAN-IN input of the next timing generator $T_B$. The SCAN-OUT output of the timing generator $T_B$ is connected to the SCAN-IN input of the next timing generator $T_C$ having its SCAN-OUT output coupled to the SCAN-IN input of the next generator, etc. Finally, the SCAN-OUT output of the last timing generator $T_N$ is connected to a SCAN-OUT pin of the microcontroller. Thus, the SCAN-OUT outputs of the preceding timing generators may be coupled with the SCAN-IN inputs of the succeeding generators to established a scan chain that allows the output values of the PLA cells to be observed on the SCAN-OUT pin. A test signal TEST is supplied to timing generators to set the scan chain.

In a normal mode of operation, the test enable signal is set low to allow a microinstruction request signal from the microcontroller control section 106 to pass through the multiplexer 108 for selecting the required PLA locations to be read. The address decoder 104 activates the PLA output lines to output the selected values via the read amplifiers $RA_A$–$RA_N$ precharged by the CLK1CLK2 signal. The outputs of the read amplifiers $RA_A$–$RA_N$ are enabled to latch the PLA output values into timing generators $T_A$–$T_N$, respectively. The non-overlapping clocks CLK1 and CLK2 gate the timing generators $T_A$–$T_N$ to generate the timing 1 and timing 2 signals A, B, C, . . . , N that represent the microinstructions stored in the PLA locations. Via the timing signal bus 112, the microcontroller is provided with the retrieved microinstructions.

At the beginning of testing operation, the test bus enable signal may be brought high to allow test inputs from the test bus 110 to be supplied through the multiplexer 108 to the address decoder 104. The test inputs define predetermined addresses of the PLA 102. As the micro ROM 100 is preprogrammed, the values stored in the PLA locations selected by the predetermined address inputs are known and may be compared with actual values read from the selected locations.

Figure 6:
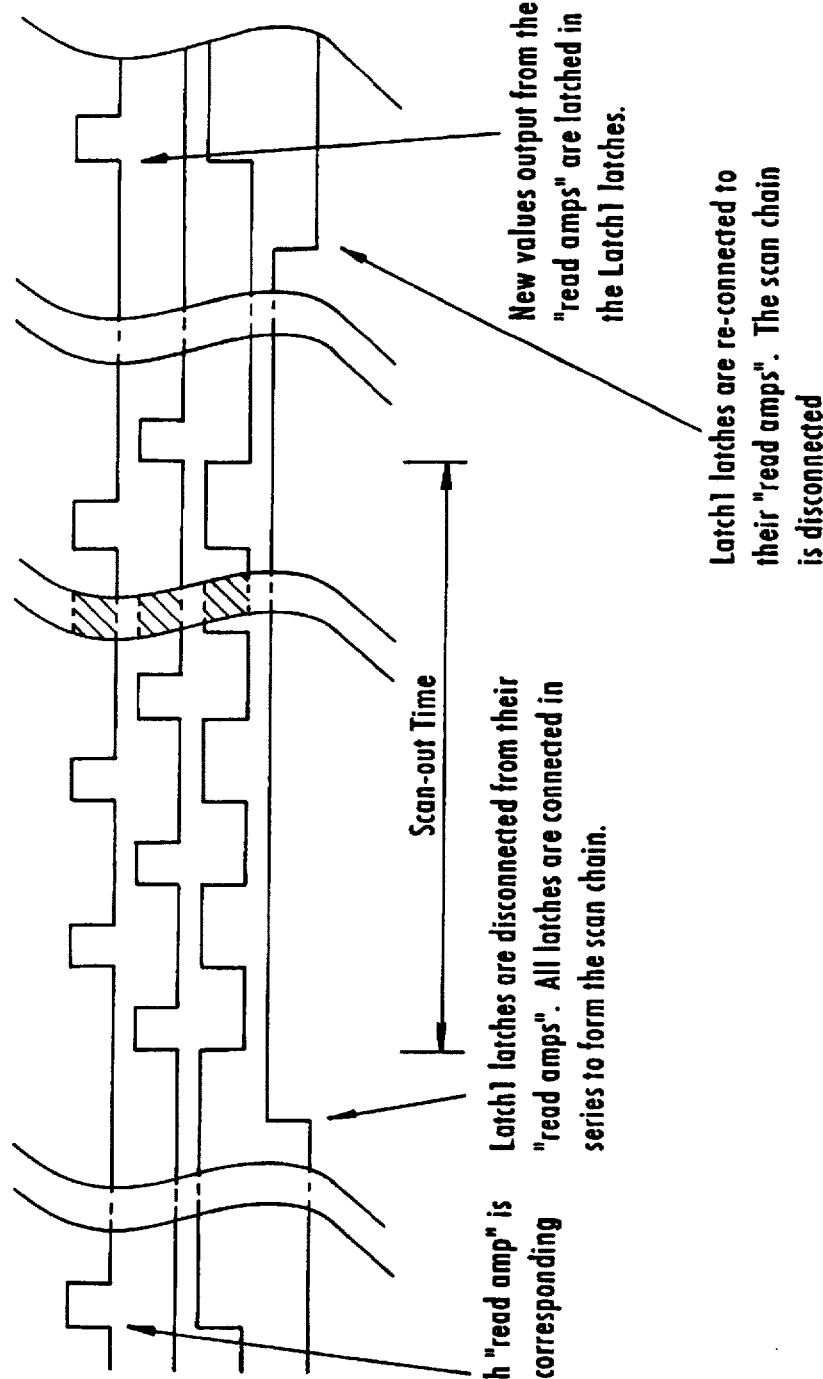

The read amplifiers $RA_A$–$RA_N$ are precharged when the CLK1CLK2 signal is low (FIG. 6C). For the PLA output lines that are not activated by the test address inputs, the read amplifiers having a pull-up configuration ties output PLA values to a high level. When the CLK1 signal goes high (FIG. 6A), the CLK1CLK2 signal also goes high. Values read from the output PLA lines activated by the test address inputs cause the inputs of the read amplifiers $RA_A$–$RA_N$ to go low. From the outputs of the read amplifiers $RA_A$–$RA_N$, the output PLA values are latched into the corresponding timing generators $T_A$–$T_N$. After the CLK1 signal goes low, the TEST signal applied to the timing generators $T_A$–$T_N$ is brought high (FIG. 6D) to disconnect the outputs of the read generators $RA_A$–$RA_N$ from the inputs of the respective timing generators $T_A$–$T_N$, and to connect the timing generators $T_A$–$T_N$ in series to form a scan chain. Then, the CLK2 signal goes high (FIG. 6B) to shift the PLA output values through the scan chain. The succeeding CLK1 and CLK2 signals supplied when the TEST signal is high provide further shift of the PLA output values through the scan chain. The PLA output values sequentially passed through the scan chain are observed at the SCAN-OUT output of the last, timing generator $T_N$ connected to the SCAN-OUT pin of the microcontroller. When the selected output values are scanned out from the scan chain, the TEST signal is brought low to connect the outputs of the read amplifiers $RA_A$–$RA_N$ to the respective timing generators $T_A$–$T_N$, and to disconnect the scan chain. New PLA output values selected by the test-inputs are allowed to be transferred by the read amplifiers $RA_A$–$RA_N$ into the respective timing generators $T_A$–$T_N$.

Then, the above-discussed scanning procedure may repeat. The structure and operation of the read amplifiers $RA_A$–$RA_N$ and the timing 1 and timing 2 generators $T_A$–$T_N$ will be discussed in more detail below.

Figure 7:
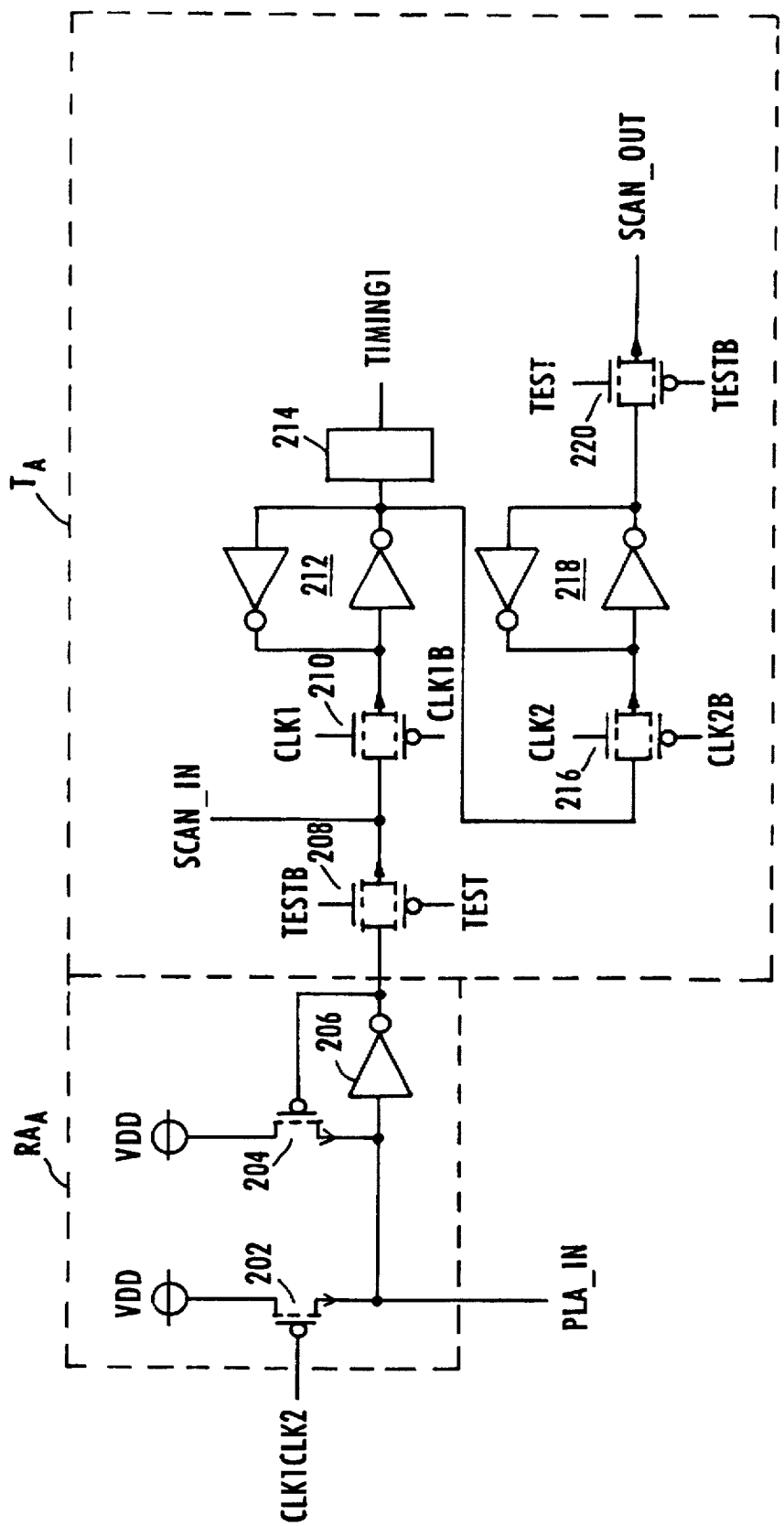
FIG. 7 is a diagram of circuitry for generating timing 1 signals supplied by the micro ROM.

Reference is now made to FIG. 7 showing circuitry for generating timing 1 signals on the outputs of the micro ROM 100. For example, this circuitry may represent the read amplifier $RA_A$ and the timing generator $T_A$ shown in FIG. 4. The read amplifier $RA_A$ comprises a pull-up configuration that includes a p-channel transistor 202 coupled to a p-channel transistor 204 having an inventer 206 between its drain and gate electrodes. Supply voltage $V_{DD}$ is supplied to the source electrodes of the transistors 202 and 204. The output line of the PLA 102 is connected to a PLA-IN input of the read amplifier $RA_A$. The CLK1CLK2 signal is supplied to the gate of the p-channel transistor 202. When the CLK1CLK2 signal is low, it pulls the PLA-IN input high to precharge the read amplifier $RA_A$. The output of the read amplifier $RA_A$ is connected to the timing generator $T_A$ through a pass-gate 208 controlled by the TEST signal. The p-channel electrode of the pass gate 208 is supplied with the TEST signal, whereas its n-channel electrode is supplied with the TESTB signal inverted with respect to the TEST signal. The output of the pass gate 208 is coupled to a pass gate 210 controlled by the CLK1 signal. The pass gate 210 has its n-channel electrode supplied with the CLK1 signal, and its p-channel electrode supplied with the CLK1B signal inverted with respect to the CLK1 signal. The SCAN-IN input is provided between the pass gates 208 and 210. The output of the pass gate 210 is connected to a memory cell 212 formed by two inverters in a feedback configuration. The memory cell 212 is used to latch the PLA output value read by the read amplifier $RA_A$. A TIMING 1 output supplies a generated timing 1 signal A to the timing signal bus 112. A buffer circuit 214 is provided between the memory cell 212 and the TIMING 1 output to condition the output signal A.

Also, the memory cell 212 is connected to a pass gate 216 controlled by the CLK2 signal supplied to its n-channel input. The p-channel input of the pass gate 216 is supplied with the CLK2B signal inverted with respect to the CLK2 signal. A memory cell 218 formed by two inverters in a feedback configuration is coupled to the output of the pass gate 216. A pass gate 220 controlled by the TEST signal supplied to its n-channel input is provided to connect the memory cell 212 to the SCAN-OUT output. The p-channel input of the pass gate 220 is supplied with the TESTB signal, inverted with respect to the TEST signal. Each of the pass gates 208, 210, 216 and 220 may be-formed by a complementary pair of MOS field-effect transistors connected in parallel.

In a normal mode of operation, the TEST signal is at a low level. A value supplied from the PLA output line is represented by a low level at the PLA-IN input. When the CLK1 signal goes high, the CLK1CLK2 signal also goes high (FIGS. 6A, 6C). As a result, a high level signal representing the output PLA value is produced at the output of the read amplifier $RA_A$ precharged by a low level of the CLK1CLK2 signal. The output PLA value is transferred to the memory cell 212 through the pass gates 208 and 210 respectively enabled by high levels of the TESTB and CLK1 signals. The buffer 214 conditions the produced timing 1 signal corresponding to the output PLA value and supplies it through the TIMING 1 output to the timing signal bus 112. The pass gate 220 is disabled by a low level of the TEST signal to prevent a signal to be supplied to the SCAN-IN input of the succeeding timing generator $T_B$.

In a test mode of operation, when the output PLA value is latched in the memory cell, the TEST signal is brought high (FIG. 6D). As a result, the pass gate 208 is disabled to disconnect the output of the read amplifier from the timing generator. The pass gate 220 is enabled to create a path for supplying the output PLA value from the SCAN-OUT output of the timing generator $T_A$ to the SCAN-IN input of the succeeding timing generator $T_B$. When the CLK2 signal goes high (FIG. 6B), the pass gate 216 is enabled to shift the output PLA value from the memory cell 212 to the memory cell 218. When the next CLK1 signal goes high, the output value from the memory cell 218 is transferred through the open pass gate 220 to the SCAN-IN input of the next timing generator, and then through the first pass gate 210 of the next timing generator, the output PLA value is latched into its first memory cell. The succeeding CLK1 and CLK2 signals supplied while the TEST signal is at a high level, cause the output PLA value to be sequentially transferred to the SCAN-OUT output of the last timing generator $T_N$. At the SCAN-OUT pin of the microcontroller connected to the SCAN-OUT output of the last timing generator $T_N$, the output PLA value may be observed and compared with a known value expected from the corresponding PLA location.

Thus, compared with the normal mode of the micro ROM operation, only the pass gates 208, 216, 220 and the memory cell 218 are added to the circuitry for generating the timing 1 signals, to support the micro ROM operation in the test mode. Moreover, only the clock signals used in the normal mode are supplied in the test mode.

Figure 8:
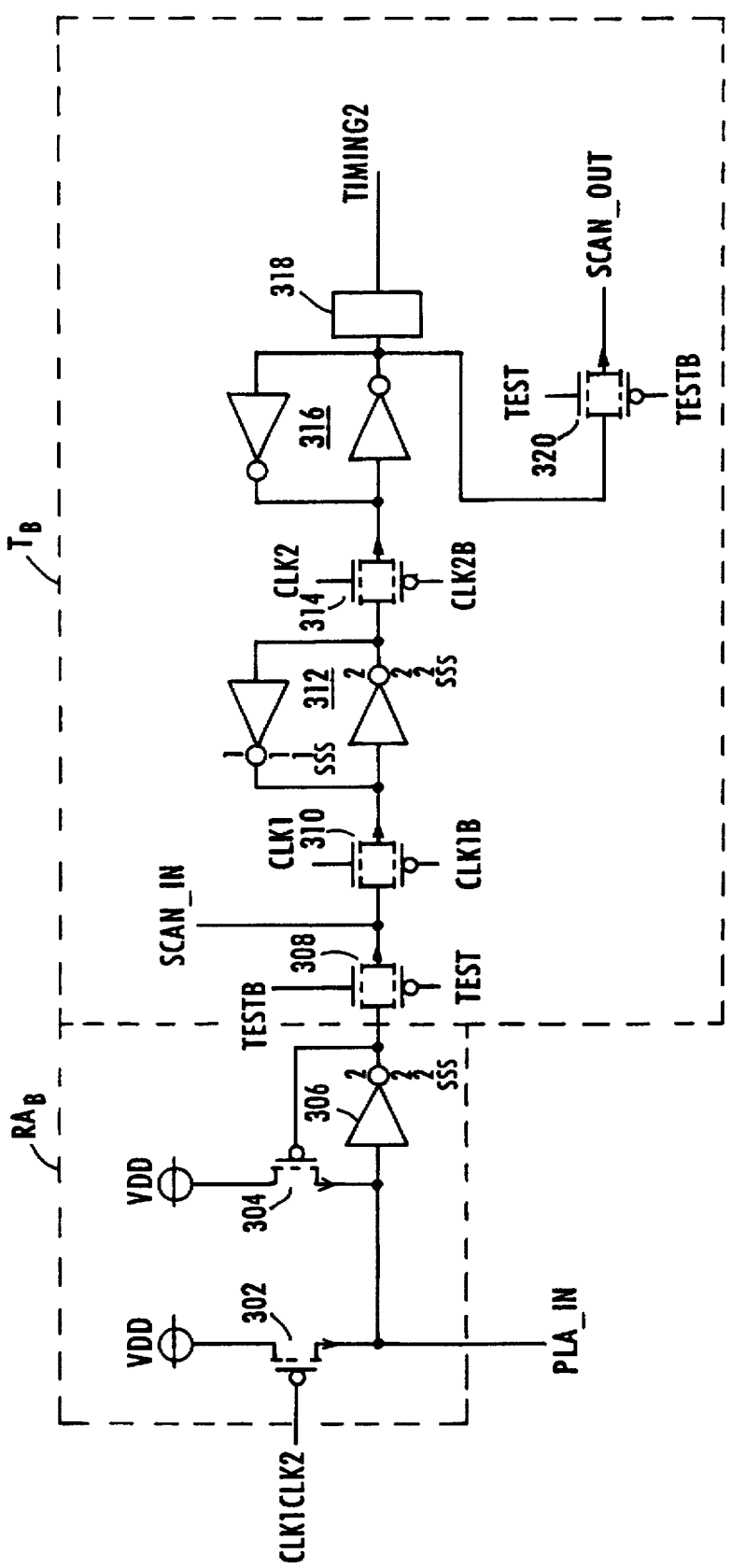
FIG. 8 is a diagram of circuitry for generating timing 2 signals supplied by the micro ROM.

Reference is now made to FIG. 8 showing circuitry for generating timing 2 signals on the outputs of the micro ROM 100. For example, this circuitry may represent the read amplifier $RA_B$ and the timing generator $T_B$ shown in FIG. 4. The read amplifier $RA_B$ comprises p-channel transistors 302, 304 and an inverter 306 that form the same structure and operate in the same way as the corresponding elements of the read amplifier $RA_A$. The timing generator $T_B$ comprises a pass gates 308 and 310, and a memory cells 312 similar to the elements of the timing generator that produce the timing 1 signal. The pass gate 308 is controlled by the TEST signal supplied to its p-channel input. The TESTB signal is supplied to the n-channel input of the pass gate 308. The pass gate 310 is controlled by the CLK1 signal supplied to its n-channel input, and by the CLK1B signal supplied to its p-channel input. The SCAN-IN input is provided between the pass gates 308 and 310.

In addition, a pass gate 314 and a memory cell 316 are connected to the memory cell 312 to convert the timing 1 signal latched in the memory cell 312 into the timing 2 signal. A buffer 318 is inserted between the memory cell 312 and a TIMING 2 output to condition the timing 2 signal B supplied to the timing signal bus 112.

Further, the memory cell 312 is coupled to a pass gate 320 controlled by the TEST signal supplied to its n-channel input and the TESTB signal supplied to its p-channel input. The pass gate 320 forms the SCAN-OUT output of the timing generator $T_B$.

In a normal mode of operation, when the TEST signal is a low level, the pass gate 308 is enabled and the pass gate 320 is disabled. As a result, when the CLK1 signal goes high, the output PLA value represented by the timing 1 signal is latched into the memory cell 312 in response to a signal supplied from the PLA output line to the PLA-IN input of the read amplifier $RA_B$. When the CLK2 signal goes high, the pass gate 314 is enabled to transfer the output PLA value from the memory cell 312 to the memory cell 316 that produces the timing 2 signal B conditioned by the buffer 318 before supplying to the timing signal 112.

In a test mode of operation, the TEST signal is brought high to disable the pass gate 308 and enable the pass gate 320. The pass gate 308 disconnects the input of the timing generator $T_B$ from the output of the read amplifier $RA_B$. The pass gate 320 connects the output of the timing generator $T_B$ to the SCAN-IN input of the next timing generator $T_C$ to establish the scan chain. Assuming that the timing generator $T_B$ is the second generator in the scan chain, it receives the PLA output value from the timing generator $T_A$ through the SCAN-IN input and the pass gate 310, when the CLK1 signal goes high. This output PLA value is latched in the memory cell 312. When the CLK2 signal goes high, the output PLA value latched in the memory cell 312 is transferred into the memory cell 316 through the pass gate 314. Upon supplying the next CLK1 signal, the output PLA value is transferred through the pass gate 320 and SCAN-OUT output to the first memory cell of the next timing generator $T_C$. The CLK1 and CLK2 signals are supplied until the output PLA value selected by the test inputs are observed at the SCAN-OUT pin of the micro ROM 102. Then, the TEST signal is brought low to latch new PLA values from the output of the read amplifier.

Thus, compared with a normal mode of the micro ROM operation, only the pass gates 308 and 320 controlled by the TEST signal are added to the circuitry for forming the timing 2 signals, in order to carry out a scan test of the micro ROM.

There accordingly has been described a system that provides micro ROM testing using timing logic and clocks utilized in normal operation of the micro ROM. A PLA in the micro ROM has its output lines coupled to read amplifiers that receive values read from the PLA locations selected by address inputs. The read amplifiers latch the PLA values into timing generators to produce timing signals of various types supplied to a microcontroller associated with the micro ROM. A test signal is supplied to the timing generators to disconnect them from the outputs of the read amplifiers and to establish a scan chain composed of the timing generators connected in series. Non-overlapping clock signals supplied by a system clock of the microcontroller cause the latched PLA values to shift through the timing generators in the scan chain. At a scan output of the last timing generator in the scan chain, the PLA values are observed and compared with the values expected from the selected PLA locations.

Accordingly, the disclosed system allows to test a micro ROM without separate test blocks and test clock signals, thereby increasing reliability and reducing the cost of testing equipment.

In this disclosure, there are shown and described only the preferred embodiments of the invention, but it is to be understood that the invention is capable of changes and modifications within the scope of the inventive concept as expressed herein.

We claim:

1. A read-only memory device comprising:
   a memory array having a plurality of output lines,
   a plurality of timing circuits coupled to said plurality of output lines for generating a timing signal on a data output of each of the timing circuits to represent data supplied from the output lines, and
   a controlled gate circuit for disconnecting data inputs of the timing circuits from the output lines and for connecting scan outputs and scan inputs of adjacent timing circuits in said plurality of timing circuits, to establish a test scan chain composed of the timing circuits connected in series for testing said memory array, wherein said plurality of timing circuits comprises first timing circuits for generating first timing signals, and second timing circuits for generating second timing signals delayed with respect to said first timing signals, each of said first timing circuits comprises a first pass gate controlled by a first clock signal, and a first memory cell for latching data transferred through said first pass gate to generate a first timing signal supplied through a data output.

2. The device of claim 1, further comprising a plurality of read amplifiers coupled between said output lines and said plurality of timing circuits.

3. The device of claim 2, wherein said controlled gate circuit disconnects the data inputs of the timing circuits from outputs of the read amplifiers to test said memory array.

4. The device of claim 1, wherein said scan chain of the timing circuits is supplied by clock signals of said microcontroller to provide data shift through the timing circuits.

5. A read-only memory device comprising:

a memory array having a plurality of output lines, a plurality of timing circuits coupled to said plurality of output lines for generating a timing signal on a data output of each of the timing circuits to represent data supplied from the output lines, a controlled gate circuit for disconnecting data inputs of the timing circuits from the output lines and for connecting scan outputs and scan inputs of adjacent timing circuits in said plurality of timing circuits, to establish a test scan chain composed of the timing circuits connected in series for testing said memory array, and a multiplexer for providing said memory array with address inputs from a control section of a microcontroller when a test bus enable signal is at a first logic level, and for providing said memory array with test inputs from a test bus when the test enable signal is at a second logic level.

6. The device of claim 1, wherein said controlled gate circuit enables each of the timing circuits to output the timing signal to control microcontroller when a test signal is at a first logic level, and establishes the test scan chain of the timing circuits when the test signal is at a second logic level.

7. The device of claim 1, wherein each of said first timing circuit further comprises a second pass gate controlled by a second clock signal for receiving data from said first memory cell, a second memory cell for latching data transferred through said second pass gate, and a scan output coupled to said second memory cell.

8. The device of claim 7, wherein said first timing circuit further comprises a scan input connected to an input of said first pass gate.

9. The device of claim 8, wherein said controlled gate circuit comprises an input pass gate coupled between a read amplifier and the scan input.

10. The device of claim 9, wherein said controlled gate circuit further comprises an output pass gate coupled between the second memory cell and the scan output.

11. The device of claim 10, wherein said input and output pass gates are controlled by a test signal.

12. The device of claim 11, wherein said input pass gate is disabled to disconnect said first timing circuit from the read amplifier, when the test signal is in a first logic state.

13. The device of claim 12, wherein said output pass gate is enabled to connect said first timing circuit through the scan output to a scan input of an adjacent timing circuit, when the test signal is in the first logic state.

14. The device of claim 1, wherein each of said second timing circuits comprises a first pass gate controlled by a first clock signal, a first memory cell for latching data transferred through said first pass gate, a second pass gate controlled by a second clock signal coupled to an output of said first memory cell, and a second memory cell for latching data transferred through said second pass gate to generate a second timing signal supplied through a data output.

15. The device of claim 14, wherein each of said second timing circuits further comprises a scan input connected to an input of said first pass gate, and a scan output connected to an output of said second memory cell.

16. The device of claim 15, wherein said controlled gate circuit comprises an input pass gate coupled between a read amplifier and the scan input.

17. The device of claim 16, wherein said controlled gate circuit further comprises an output pass gate coupled between the second memory cell and the scan output.

18. The device of claim 17, wherein said input and output pass gates are controlled by a test signal.

19. The device of claim 18, wherein said input pass gate is disabled to disconnect said second timing circuit from the read amplifier, when the test signal is in a first logic state.

20. The device of claim 19, wherein said output pass gate is enabled to connect said second timing circuit through the scan output to a scan input of an adjacent timing circuit, when the test signal is in the first logic state.

21. A read-only memory device for storing microinstructions in a microcontroller comprising:

a programmable logic array having output lines for supplying the microinstructions, a plurality of timing generators coupled in parallel to the output lines for producing timing signals representing the microinstructions, a test control circuit coupled to the timing generators to disconnect their inputs from the output lines and to establish a test scan chain composed of the timing generators connected in series to test the programmable logic array, and a multiplexer for providing said memory array with address inputs from said microcontroller when a test control signal is at a first logic level, and for providing said memory array with test inputs when the test control signal is at a second logic level.

22. A method for testing a read-only memory having a memory array and timing generators connectable to output lines of the memory array for generating timing signals representing data read from the memory array, said method comprising the steps of:

connecting inputs of the timing generators to the output lines to receive the data from tested cells of the memory array, disconnecting the inputs of the timing generators from the output lines, connecting the timing generators in series to establish a scan chain, shifting the data received from the tested cells through the timing generators in the scan chain, and observing the data from the tested cell at an output of the last timing generator in the scan chain, wherein said memory array being provided with address inputs from an external controller when a test control signal is at a first logic level, and with test inputs from a test bus when the test control signal is at a second logic level.

23. The device of claim 5, wherein said memory array stores microinstructions to control said microcontroller.

* * * * *